United States Patent
Yuan et al.

(10) Patent No.: US 9,780,122 B2
(45) Date of Patent: Oct. 3, 2017

(54) ARRAY SUBSTRATE, DISPLAY PANEL AND DISPLAY DEVICE

(71) Applicants: SHANGHAI TIANMA MICRO-ELECTRONICS CO., LTD., Shanghai (CN); TIANMA MICRO-ELECTRONICS CO., LTD., Shenzhen (CN)

(72) Inventors: Yong Yuan, Shanghai (CN); Quanpeng Yu, Shanghai (CN); Meng Cui, Shanghai (CN); Zhongshou Huang, Shanghai (CN)

(73) Assignees: SHANGHAI TIANMA MICRO-ELECTRONICS CO., LTD., Shanghai (CN); TIANMA MICRO-ELECTRONICS CO., LTD., Shenzhen (CN)

( * ) Notice: Subject to any disclaimer, the term of this patent is extended or adjusted under 35 U.S.C. 154(b) by 0 days.

(21) Appl. No.: 14/862,537

(22) Filed: Sep. 23, 2015

(65) Prior Publication Data

US 2016/0293632 A1  Oct. 6, 2016

(30) Foreign Application Priority Data

Apr. 1, 2015  (CN) .......................... 2015 1 0152727

(51) Int. Cl.
*H01L 27/12* (2006.01)

(52) U.S. Cl.
CPC ........ *H01L 27/124* (2013.01); *H01L 27/1248* (2013.01)

(58) Field of Classification Search
CPC .................................................. H01L 27/3248
See application file for complete search history.

(56) References Cited

U.S. PATENT DOCUMENTS

| 4,371,412 A | * | 2/1983 | Nishizawa | ............... H01J 37/16 |
| 5,958,141 A | * | 9/1999 | Kitabatake | ........ H01J 37/32082 |
| | | | | 118/723 MA |
| 6,146,542 A | * | 11/2000 | Ha | ........................... C23F 4/00 |
| | | | | 216/2 |

(Continued)

FOREIGN PATENT DOCUMENTS

| CN | 1495495 A | 5/2004 |
| CN | 104460080 A | 3/2015 |
| CN | 104460163 A | 3/2015 |

OTHER PUBLICATIONS

Chinese Application No. 201510152727.6, First Office Action mailed Feb. 28, 2017.

*Primary Examiner* — Thao P Le
(74) *Attorney, Agent, or Firm* — Alston & Bird LLP

(57) ABSTRACT

An array substrate, a display panel and a display device are provided. The array substrate includes: a substrate, wherein a signal transmission line, a first insulator layer, a second insulator layer, a pixel electrode layer and a common electrode layer are disposed on the substrate, wherein the first insulator layer is disposed between the signal transmission line and the common electrode layer, and the second insulator layer is disposed between the pixel electrode layer and the common electrode layer, and wherein a dielectric constant of the first insulator layer is less than or equal to a dielectric constant of the second insulator layer, and the signal transmission line is electrically connected with the common electrode layer. A parasitic capacitance between the signal transmission line and the common electrode layer is reduced in the array substrate.

8 Claims, 3 Drawing Sheets

(56) References Cited

U.S. PATENT DOCUMENTS

| | | | |
|---|---|---|---|
| 6,791,199 B2* | 9/2004 | Sakamoto | H01L 21/4832 257/778 |
| 2001/0006325 A1* | 7/2001 | Choi | H01J 1/3042 313/495 |
| 2004/0046902 A1 | 3/2004 | Yamasaki | |
| 2004/0070313 A1* | 4/2004 | Furukawa | H03H 9/14541 310/313 R |
| 2008/0017855 A1* | 1/2008 | Kim | G02F 1/1309 257/48 |
| 2008/0017862 A1* | 1/2008 | Lee | G02F 1/136286 257/59 |
| 2008/0186434 A1* | 8/2008 | Yun | G02F 1/1362 349/106 |
| 2008/0284969 A1* | 11/2008 | Lim | G02F 1/13458 349/152 |
| 2009/0039350 A1* | 2/2009 | Oh | H01L 27/124 257/59 |
| 2009/0236605 A1* | 9/2009 | Qiu | H01L 27/1214 257/72 |
| 2010/0039592 A1* | 2/2010 | Wang | G02F 1/134363 349/106 |
| 2011/0049100 A1* | 3/2011 | Han | H01J 37/32623 216/67 |
| 2011/0049521 A1* | 3/2011 | Chen | G02F 1/133351 257/72 |
| 2011/0156038 A1* | 6/2011 | Yang | G02F 1/136213 257/59 |
| 2012/0056858 A1* | 3/2012 | Ahn | G11C 19/28 345/204 |
| 2012/0154729 A1* | 6/2012 | Lee | G02F 1/136209 349/138 |
| 2013/0114014 A1* | 5/2013 | Kwak | G02F 1/13454 349/43 |
| 2014/0367720 A1* | 12/2014 | Kim | H01L 33/42 257/98 |
| 2015/0179410 A1* | 6/2015 | Ji | H01J 37/32541 156/345.1 |
| 2015/0279287 A1* | 10/2015 | Liu | G06F 3/0412 345/173 |
| 2016/0056118 A1* | 2/2016 | Yoon | H01L 24/16 257/99 |
| 2016/0149086 A1* | 5/2016 | Sim | H01L 33/46 257/98 |
| 2016/0246398 A1 | 8/2016 | Huang et al. | |

* cited by examiner

ARRAY SUBSTRATE, DISPLAY PANEL AND DISPLAY DEVICE

CROSS-REFERENCE TO RELATED APPLICATIONS

The present application claims priority to Chinese Patent Application No. 201510152727.6, entitled "ARRAY SUBSTRATE, DISPLAY PANEL AND DISPLAY DEVICE", filed on Apr. 1, 2015 with the State Intellectual Property Office of People's Republic of China, which is incorporated herein by reference in its entirety.

BACKGROUND

Compared with a conventional touch display device having a touch panel disposed on a Liquid Crystal Display (LCD) panel, a touch display device has become a mainstream of the touch display device technology. The touch display device, which integrated the touch panel and the LCD panel, has advantages of reduced usage of substrate and a smaller thickness. The touch display device integrating the touch panel and the LCD panel may have an on-cell structure or an in-cell structure. In the in-cell structure, a touch panel function is embedded in a TFT array substrate.

Nowadays, touch electrodes and common electrodes of a self-contained in-cell touch display are used in common. As shown in FIG. 1, the common electrode (com) is divided into a plurality of electrode blocks which are insulated from each other, and each of the plurality of electrode blocks is illustrated as a rectangular block E in FIG. 1. Each electrode block can be used, not only as a common electrode, but also a touch electrode. Each electrode block is connected with a signal transmission line S, which is adapted to provide the electrode block a common electrode signal and a touch detection signal.

However, in a TFT array substrate having the In-Cell touch panel, a parasitic capacitance between the signal transmission line and the common electrode is high, which results in a load of the TFT array substrate which is too large, a charging time of the touch electrode is long, and a touch sensitivity of the touch panel is reduced.

BRIEF DESCRIPTION OF THE DRAWINGS

In order to clarify the technical solution of the present disclosure, the figures used in the description of embodiments of the present disclosure will be briefly described hereunder. Obviously, these figures only refer to preferred embodiments of the present disclosure, and various changes may be made by those skilled in the art without departing from the spirit or scope of this disclosure.

DETAILED DESCRIPTION

The technical solutions in the embodiments of the invention will be described clearly and completely in conjunction with the drawings of the embodiments of the invention hereinafter. Apparently, the described embodiments are only some of the embodiments of the invention, but not all the embodiments. All of other embodiments obtained based on the embodiments of the invention by those skilled in the art without any creative work fall within the scope of protection of the disclosure.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Although specific terms are employed herein, they are used in a generic and descriptive sense only and not for purposes of limitation.

In order to clarify the objects, characteristics and advantages of the disclosure, the embodiments of the present disclosure will be described in detail in conjunction with the accompanying drawings.

An array substrate is provided in embodiments of the present disclosure.

The array substrate in the present disclosure has a structure with a common electrode layer under a pixel electrode layer, which can be referred to as a Middle-Com structure. A structure diagram of the array substrate having the Middle-Com structure is schematically illustrated in FIG. 2.

The array substrate having the Middle-Com structure will be described in conjunction with FIG. 2 hereunder.

Figure 1:
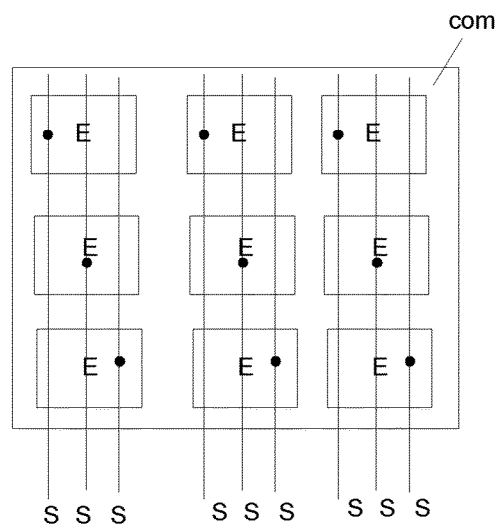
FIG. 1 schematically illustrates a planar structure diagram of a conventional array substrate.
Figure 2:
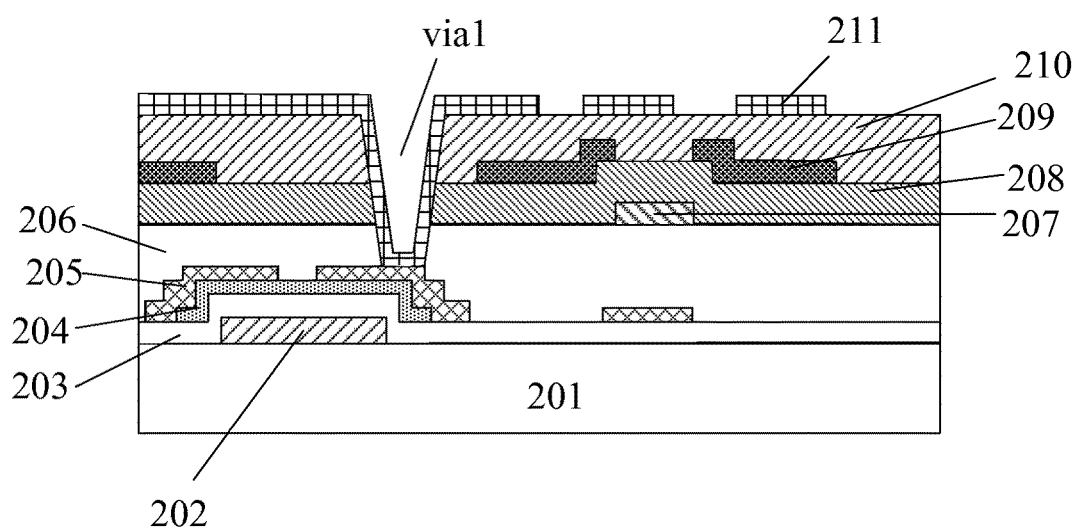
FIG. 2 schematically illustrates a structure diagram of an array substrate according to an embodiment of the present disclosure.

As shown in FIG. 2, the array substrate includes:

a substrate 201;

a gate layer 202 disposed on the substrate 201;

a gate insulator layer 203 disposed on the gate layer 202;

a semiconductor layer 204 disposed on the gate insulator layer 203, wherein the semiconductor layer 204 only overlaps a part of the gate insulator layer 203 which is above the gate layer 202;

a data line layer 205 disposed on the gate insulator layer 203, wherein a first electrode, a second electrode and data lines of each thin film transistor are disposed on the data line layer 205;

a third insulator layer 206 disposed on the data line layer 205, wherein the third insulator layer 206 is typically an organic insulator layer;

a signal transmission line 207 disposed on the third insulator layer 206, wherein the signal transmission line 207 is typically a metal line;

a first insulator layer 208 disposed on the signal transmission line 207;

a common electrode 209 disposed on the first insulator 208;

a second insulator 210 disposed on the common electrode layer 209; and a pixel electrode layer 211 disposed on the second insulator layer 210.

In one embodiment of the present disclosure, a via hole (via1) is disposed in the first insulator layer 208 and the second insulator layer 210, the pixel electrode layer 211 is electrically connected with the first electrode disposed on the data line layer 205 through the via hole (via1). In another embodiment of the present disclosure, the pixel electrode layer 211 may overlap a part of the first electrode, so as to obtain an electrical connection between them through the overlapping part.

In addition, it should be noted that, in some embodiments of the present disclosure, the first insulator layer 208 and the second insulator layer 210 include different dielectric materials, and a dielectric constant of the first insulator 208 is lower than a dielectric constant of the second insulator 210. In order to obtain a large storage capacitor constituted by the common electrode layer 209 and the pixel electrode layer 211, the second insulator layer 210 between the common electrode layer 209 and the pixel electrode layer 211 may include a dielectric material having a high dielectric constant, for example, $Si_3N_4$, $HfO_2$, $ZrO_2$, $Al_2O_3$, $Ta_2O_5$, $TiO_2$, $ZnO$, $CeO_2$, $Y_2O_3$, ferroelectric material, or other high dielectric constant material.

Moreover, in order to reduce a parasitic capacitance between the signal transmission line 207 and the common electrode layer 209, the first insulator layer 208 between the signal transmission line 207 and the common electrode layer 209 may include a dielectric material having a low dielectric constant, for example, silicon oxide, fluorine-doped silicon oxide, or carbon-doped silicon oxide.

In the array substrate provided in embodiments of the present disclosure, because the first insulator layer 208 and the second insulator layer 210 have different materials, the storage capacitor and the parasitic capacitor between the signal transmission line 207 and the common electrode layer 209 can be controlled independently. Therefore, the array substrate of the present disclosure can reduce the parasitic capacitance between the signal transmission line and the common electrode layer without affecting the storage capacitor between the common electrode layer and the pixel electrode layer.

The embodiments of the present disclosure reduce the parasitic capacitance through the first insulator layer 208 which has a low dielectric constant. The reduction of the parasitic capacitance helps to reduce the load of the touch panel, so that a charging time of the touch electrode is reduced, and a touch sensitivity of the touch panel is improved. Therefore, the array substrate of the present disclosure can be used in a high-resolution touch display.

Moreover, according to an equation $C=\in S/d$ for calculating capacitance, besides the dielectric constant, a plate area of the capacitor also affects the capacitance size. In a preferred embodiment of the present disclosure, in order to reduce an overlap area of the common electrode layer 209 and the signal transmission line 207, the common electrode 209 has a slotted region, wherein the signal transmission line 207 corresponds to the slotted region. The slotted region in the common electrode layer 209 is disposed right above the signal transmission line 209. That is, the signal transmission line 207 is disposed right below the slotted region of the common electrode layer 209, so as to reduce the overlap area between the common electrode area 209 and the signal transmission line 207, and reduce the parasitic capacitor.

It should be noted that, the signal transmission line 207 provides a common voltage signal and a touch detection signal to the common electrode, so that the signal transmission line 207 should be electrically connected with the common electrode layer. In one embodiment of the present disclosure, in order to electrically connect the signal transmission line 207 and the common electrode layer 209, a first via hole (not shown in FIG. 2) is disposed in the first insulator layer 208. Therefore, the common electrode layer 209 can be electrically connected with the signal transmission line 207 through the first via hole.

In addition, the signal transmission line 207 is usually long. In order to reduce resistance, a metal layer for forming the signal transmission line 207 has a large thickness, which may result in light leakage in dark state and corrosion. However, in embodiments of the present disclosure, the first insulator layer 208 and the second insulator layer 210 cover the signal transmission line 207. These two insulator layers can protect the signal transmission line 207 well. Therefore, light leakage in dark state and corrosion of the signal transmission line 207 are prevented in the array substrate of the present disclosure.

The array substrates described above have a Middle-Com structure.

Figure 3:
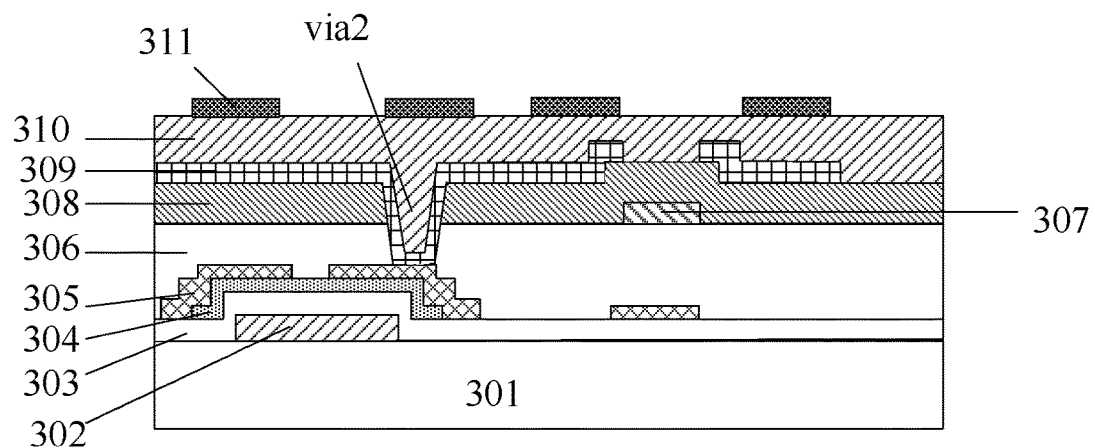
FIG. 3 schematically illustrates a structure diagram of another array substrate according to an embodiment of the present disclosure.

Moreover, according to some embodiments of the present disclosure, the array substrate may have a structure with the common electrode layer disposed above the pixel electrode layer, which may be referred to as a Top-Com structure. A diagram of the Top-Com structure is illustrated in FIG. 3.

The Top-Com structure array substrate will be described hereunder. Referring to FIG. 3, the array substrate includes:
a substrate 301;
a gate layer 302 disposed on the substrate 301;
a gate insulator layer 303 disposed on the gate layer 302;
a semiconductor layer 304 disposed on the gate insulator layer 303, wherein the semiconductor layer 304 only overlaps a part of the gate insulator layer 303;
a data line layer 305 disposed on the gate insulator layer 303, wherein a first electrode and a second electrode of each thin film transistor is disposed on the data line layer 305;
a third insulator layer 306 disposed on the data line layer 305, wherein the third insulator layer 306 is typically an organic insulator layer;
a signal transmission line 307 disposed on the third insulator layer 306, wherein the signal transmission line 307 is typically a metal line;
a first insulator layer 308 disposed on the signal transmission line 307;
a pixel electrode layer 309 disposed on the first insulator layer 308;
a second insulator layer 310 disposed on the pixel electrode layer 309; and
a common electrode layer 311 disposed on the second insulator layer 310.

In one embodiment of the present disclosure, a via hole (via2) is disposed in the first insulator layer 308. The pixel electrode layer 309 is electrically connected with the first electrode disposed on the data line layer 305 through the via hole (via2).

As described in the Middle-Com structure array substrate, in the Top-Com structure array substrate, the first insulator layer 308 and the second insulator layer 310 include different dielectric materials, and a dielectric constant of the first insulator 308 is lower than a dielectric constant of the second insulator 310. Therefore, the Top-Com structure array substrate of the present disclosure has the same advantages as the Middle-Com structure array substrate. For simplicity, these advantages refer to the Middle-Com structure array substrate described above, and will not be described in detail herein.

It should be noted that the signal transmission line 307 provides a common voltage signal and a touch detection signal to the common electrode, so that the signal transmission line 307 should be electrically connected with the common electrode layer. In one embodiment of the present disclosure, in order to electrically connect the signal transmission line 307 and the common electrode layer 311, a second via hole (not shown in FIG. 3) is disposed in the first insulator layer 308 and the second insulator layer 310. Therefore, the common electrode layer 311 can be electrically connected with the signal transmission line 307 through the second via hole.

The array substrate described above has a Top-Com structure according to embodiments of the present disclosure.

It should be noted that, the array substrates illustrated in FIG. 2 and FIG. 3 have a bottom-gate structure. That is, the gate layer is disposed under the semiconductor layer. In the array substrate having the bottom-gate structure, the semiconductor layer is generally amorphous silicon.

In addition, as a modification of the present disclosure, the array substrate may have a top-gate structure. Namely, the gate layer is disposed above the semiconductor layer. In the array substrate having the top-gate structure, the semiconductor layer is generally low-temperature polysilicon.

The array substrate having the top-gate structure may also have the Middle-Com structure or the Top-Com structure, which will be described in detail hereunder.

Figure 4:
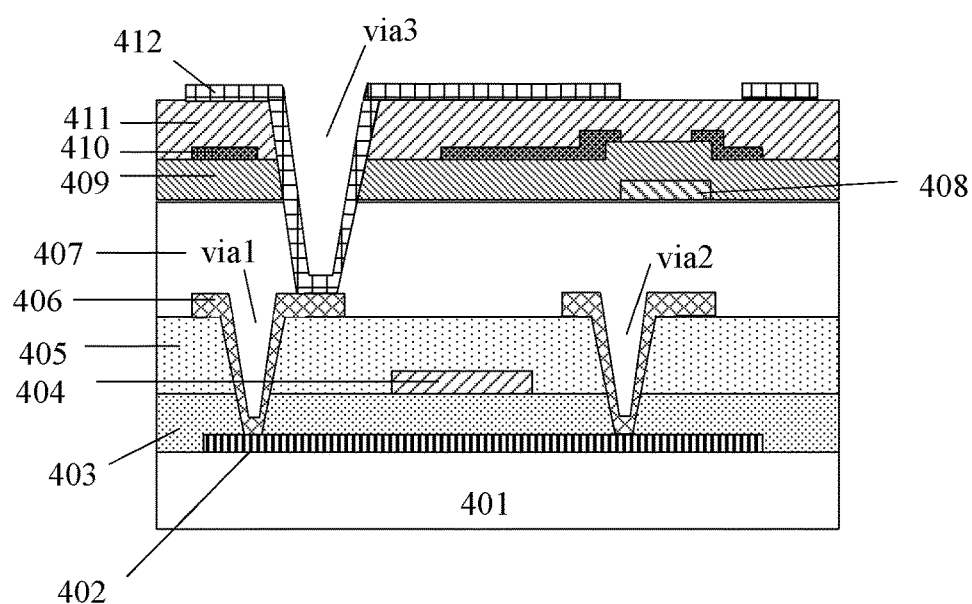
FIG. 4 schematically illustrates a structure diagram of a third array substrate according to an embodiment of the present disclosure.

A structure diagram of a third array substrate is illustrated in FIG. 4 according to an embodiment of the present disclosure. As shown in FIG. 4, the array substrate has a top-gate structure, and meanwhile a Middle-Com structure.

As shown in FIG. 4, the array substrate includes:
a substrate 401;
a semiconductor layer 402 disposed on the substrate 401;
a fourth insulator layer 403 disposed on the semiconductor layer 402;
a gate layer 404 disposed on the fourth insulator layer 403;
a gate insulator layer 405 disposed on the gate layer 404, wherein a first via hole (via1) and a second via hole (via2) are disposed in the gate insulator layer 405;
a data line layer 406 disposed on the gate insulator layer 405, wherein a first electrode, a second electrode and data lines are disposed on the data line layer 406, the first electrode is electrically connected with the semiconductor layer 402 through the first via hole (via1), and the second electrode is electrically connected with the semiconductor layer 402 through the second via hole (via2); and
a third insulator layer 407 disposed on the data line layer 406, wherein the third insulator layer 407 is typically an organic insulator layer,
wherein a signal transmission line 408, a first insulator layer 409, a common electrode layer 410, a second insulator layer 411 and a pixel electrode layer 412 are successively disposed on the third insulator layer 407; and
wherein a third via hole (via3) is disposed in the first insulator layer 409 and the second insulator layer 411, and the pixel electrode layer 412 is electrically connected with the first electrode through the third via hole (via3).

In this embodiment, in order to electrically connect the signal transmission line 408 and the common electrode layer 410, a first through hole (not shown in FIG. 4) is disposed in the first insulator layer 409. Through the first through hole, the common electrical layer 410 and the signal transmission line 408 are electrically connected.

In this embodiment, the first insulator layer 409 and the second insulator layer 411 have same materials as the first insulator layer and the second insulator layer of the embodiment illustrated in FIG. 2. Therefore, the array substrate of this embodiment has the same advantages as the embodiment shown in FIG. 2. For simplicity, these advantages refer to the embodiment described in conjunction with FIG. 2, and will not be described in detail herein.

Figure 5:
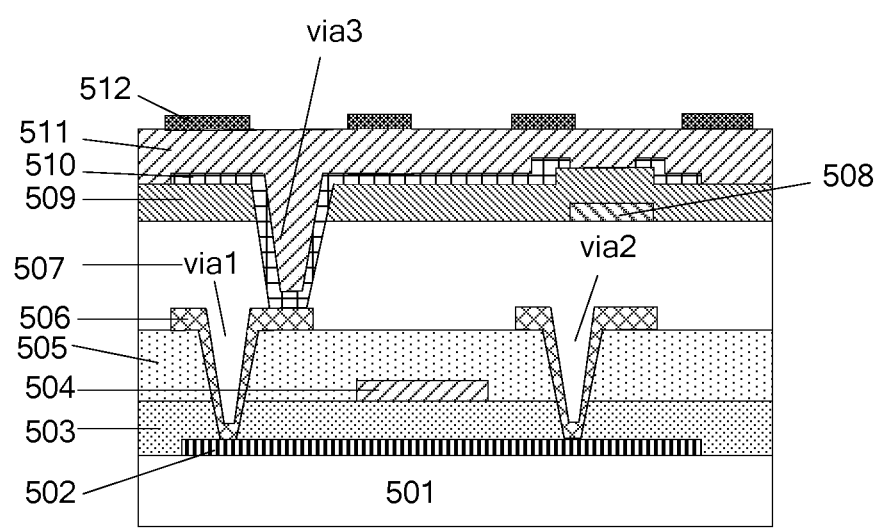
FIG. 5 schematically illustrates a structure diagram of a fourth array substrate according to an embodiment of the present disclosure.

A structure diagram of a fourth array substrate is illustrated in FIG. 5 according to one embodiment of the present disclosure. As shown in FIG. 5, the array substrate has a top-gate structure, and meanwhile a Top-Com structure.

As shown in FIG. 5, the array substrate includes:
a substrate 501;
a semiconductor layer 502 disposed on the substrate 501;
a fourth insulator layer 503 disposed on the semiconductor layer 502;
a gate layer 504 disposed on the fourth insulator layer 503;
a gate insulator layer 505 disposed on the gate layer 504, wherein a first via hole (via1) and a second via hole (via2) are disposed in the gate insulator layer 505;
a data line layer 506 disposed on the gate insulator layer 505, wherein a first electrode, a second electrode and data lines are disposed on the data line layer 506, the first electrode is electrically connected with the semiconductor layer 502 through the first via hole (via1), and the second electrode is electrically connected with the semiconductor layer 502 through the second via hole (via2); and
a third insulator layer 507 disposed on the data line layer 506,
wherein a signal transmission line 508, a first insulator layer 509, a pixel electrode layer 510, a second insulator layer 511 and a common electrode layer 512 are successively disposed on the third insulator layer 507; and
wherein a third via hole (via3) is disposed in the first insulator layer 509, and the pixel electrode layer 510 is electrically connected with the first electrode through the third via hole (via3).

In some embodiments, in order to electrically connect the signal transmission line 508 and the common electrode layer 512, a second through hole (not shown in FIG. 5) is disposed in the first insulator layer 509 and the second insulator layer 511. Therefore, the common electrical layer 512 and the signal transmission line 508 can be electrically connected through the second through hole.

In this embodiment, the first insulator layer 509 and the second insulator layer 511 have same materials as the first insulator layer and the second insulator layer of the embodiment illustrated in FIG. 2. Therefore, the array substrate of this embodiment has the same advantages as the embodiment shown in FIG. 2. For simplicity, these advantages refer to the embodiment described in conjunction with FIG. 2, and will not be described in detail herein.

According to the array substrate in above embodiments, a display panel is also provided in the present disclosure. The display panel includes an array substrate according to any one of the above embodiments.

According to the display panel described above, a display device is also provided in this disclosure. The display device includes the above display panel. A method for driving the display device includes a plurality of display period and a plurality of touch period which are alternately distributed, wherein, in the display period, a display signal is applied to corresponding common electrodes through the signal transmission line, and in the touch period, a touch detection signal is applied to corresponding common electrodes though the signal transmission line. Therefore, the common electrode of the present disclosure can be used as a touch electrode. The display device may be a device having a display function, such as a phone, a computer, a wearable electronic device, etc.

Although the present disclosure has been disclosed above with reference to preferred embodiments thereof, it should be understood by those skilled in the art that various changes may be made without departing from the spirit or scope of the disclosure. Accordingly, the present disclosure is not limited to the embodiments disclosed.

What is claimed is:

1. An array substrate, comprising: a substrate, wherein a signal transmission line, a first insulator layer, a second insulator layer, a pixel electrode layer and a common electrode layer are disposed on the substrate;
   wherein the first insulator layer is disposed on the signal transmission line, the common electrode layer is disposed on the first insulator layer, the second insulator layer is disposed on the common electrode layer, and the pixel electrode layer is disposed on the second insulator layer; and
   wherein a dielectric constant of the first insulator layer is less than or equal to a dielectric constant of the second insulator layer, and the signal transmission line is electrically connected with the common electrode layer.

2. The array substrate according to claim 1, wherein the first insulator layer comprises silicon oxide, fluorine-doped silicon oxide, or carbon-doped silicon oxide.

3. The array substrate according to claim 1, wherein the second insulator layer comprises $Si_3N_4$, $HfO_2$, $ZrO_2$, $Al_2O_3$, $Ta_2O_5$, $TiO_2$, ZnO, $CeO_2$, $Y_2O_3$, or ferroelectric material.

4. The array substrate according to claim 1, further comprising:
   a gate layer disposed on the substrate;
   a gate insulator layer disposed on the gate layer;
   a semiconductor layer disposed on the gate insulator layer;
   a data line layer disposed on the gate insulator layer, wherein a first electrode, a second electrode and a data line are disposed on the data line layer; and
   a third insulator layer disposed on the data line layer,
   wherein the signal transmission line, the first insulator layer, the common electrode layer, the second insulator layer and the pixel electrode layer are successively disposed on the third insulator.

5. The array substrate according to claim 4, wherein a first via hole is disposed in the first insulator layer, and the signal transmission line is electrically connected with the common electrode layer through the first via hole.

6. The array substrate according to claim 1, wherein a slotted region is disposed in the common electrode layer, and the signal transmission line is disposed corresponding to the slotted region.

7. A display panel using an array substrate, the display panel comprising:
   a substrate, wherein a signal transmission line, a first insulator layer, a second insulator layer, a pixel electrode layer and a common electrode layer are disposed on the substrate;
   wherein the first insulator layer is disposed on the signal transmission line, the common electrode layer is disposed on the first insulator layer, the second insulator layer is disposed on the common electrode layer, and the pixel electrode layer is disposed on the second insulator layer; and
   wherein a dielectric constant of the first insulator layer is less than or equal to a dielectric constant of the second insulator layer, and the signal transmission line is electrically connected with the common electrode layer.

8. A display device, comprising: the display panel according to claim 7.

* * * * *